(12) United States Patent
Stefanini et al.

(10) Patent No.: US 10,573,479 B2
(45) Date of Patent: Feb. 25, 2020

(54) MEMS MEMBRANE WITH INTEGRATED TRANSMISSION LINE

(71) Applicant: AIRMEMS, Limoges (FR)

(72) Inventors: Romain Stefanini, Limoges (FR); Ling Yan Zhang, Cognac-la-Foret (FR); Abedel Halim Zahr, Limoges (FR)

(73) Assignee: AIRMEMS (FR)

( * ) Notice: Subject to any disclaimer, the term of this patent is extended or adjusted under 35 U.S.C. 154(b) by 0 days.

(21) Appl. No.: 16/304,274

(22) PCT Filed: May 19, 2017

(86) PCT No.: PCT/FR2017/051239
§ 371 (c)(1),
(2) Date: Nov. 24, 2018

(87) PCT Pub. No.: WO2017/203141
PCT Pub. Date: Nov. 30, 2017

(65) Prior Publication Data
US 2019/0088435 A1 Mar. 21, 2019

(30) Foreign Application Priority Data
May 24, 2016 (FR) .................................. 16 54615

(51) Int. Cl.
*H01H 59/00* (2006.01)

(52) U.S. Cl.
CPC ..... *H01H 59/0009* (2013.01); *B81B 2201/01* (2013.01); *B81B 2203/01* (2013.01);
(Continued)

(58) Field of Classification Search
CPC ........ B81B 2201/016; B81B 2201/012; B81B 2201/014; B81B 2201/01; B81B 2203/01;
(Continued)

(56) References Cited

U.S. PATENT DOCUMENTS 6,486,425 B2 * 11/2002 Seki ................... H01H 59/0009
200/181
7,477,884 B2 * 1/2009 Choi .................. H01H 59/0009
200/181
(Continued)

FOREIGN PATENT DOCUMENTS

EP 0 709 911 A2 5/1996
EP 1 798 745 A2 6/2007
(Continued)

OTHER PUBLICATIONS

International Search Report (with English translation) dated Aug. 10, 2017 for International application No. PCT/FR2017/051239.
(Continued)

*Primary Examiner* — Vanessa Girardi
(74) *Attorney, Agent, or Firm* — Fay Sharpe LLP

(57) ABSTRACT

A micro-electromechanical-system (MEMS) switch (1) is formed in a substrate (2) and includes a first RF signal line (3) and a second RF signal line (4), a deformable membrane (5), an activator (7) configured to deform the membrane (5), a substrate track, and a membrane track. The RF signal lines (3, 4) are connected by one of the membrane track and the substrate track. A membrane RF ground (9, 10) is integrated into the membrane (5), and the membrane RF ground is electrically connected to a substrate RF ground (11, 12, 3, 14), the membrane RF ground framing and being formed parallel to at least one among the membrane track (8) and the substrate track, such that the RF ground (9, 10) closely follows the RF signal path, in order to guide the propagation of the RF signal of the first RF signal line (3) to the second RF signal line (4) when the switch is in the on state.

14 Claims, 9 Drawing Sheets

(52) U.S. Cl.
CPC ............... *H01H 2059/0027* (2013.01); *H01H 2239/004* (2013.01); *H01H 2239/018* (2013.01)

(58) Field of Classification Search
CPC .... B81B 2203/0109; B81B 2203/0118; H01H 59/0009; H01H 2059/0027
See application file for complete search history.

(56) References Cited

U.S. PATENT DOCUMENTS

| | | | |
|---|---|---|---|
| 8,018,307 B2* | 9/2011 | Van Beek | H01H 59/0009 200/181 |
| 9,966,194 B2* | 5/2018 | Gupta | B81B 7/0064 |
| 9,984,269 B1* | 5/2018 | Roizin | G06K 9/00013 |
| 2006/0084198 A1 | 4/2006 | Ziaei et al. | |
| 2014/0184028 A1 | 7/2014 | Hsu et al. | |
| 2017/0316907 A1 | 11/2017 | Blondy et al. | |

FOREIGN PATENT DOCUMENTS

| | | |
|---|---|---|
| FR | 3 027 448 A1 | 4/2016 |
| WO | WO 2004/030005 A1 | 4/2004 |

OTHER PUBLICATIONS

Written Opinion (with English translation) dated Aug. 10, 2017 for International application No. PCT/FR2017/051239.
International Preliminary Report on Patentability dated Nov. 27, 2018 for International application No. PCT/FR2017/051239.
Search Report completed Dec. 13, 2016 for French Application No. FR 1654615.
Written Opinion Regarding the Patentability of Invention for French Application No. FR 1654615 dated Dec. 19, 2016 (with English Translation).

* cited by examiner

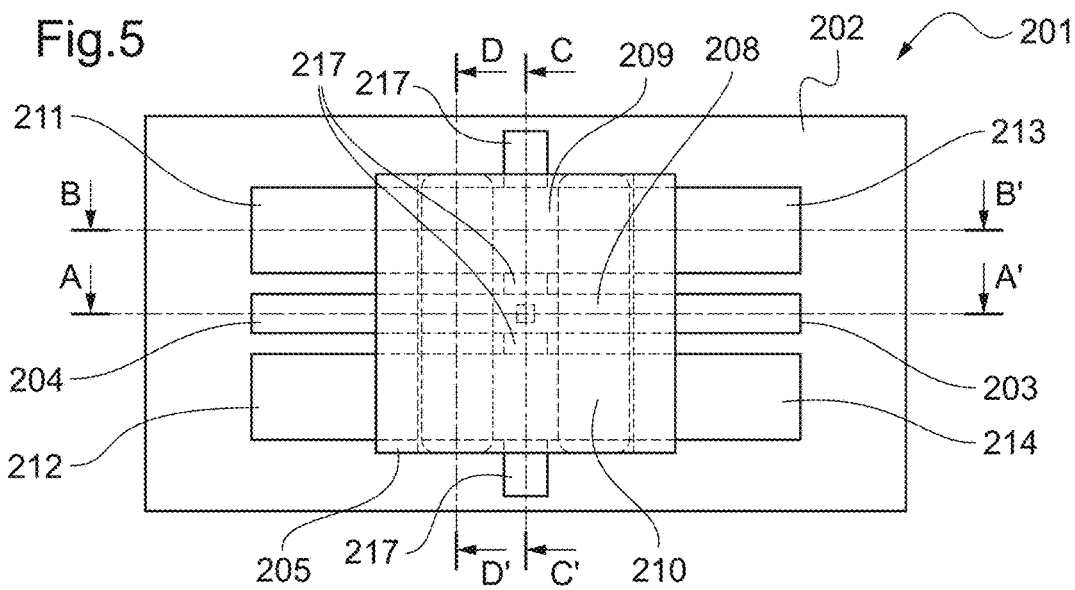
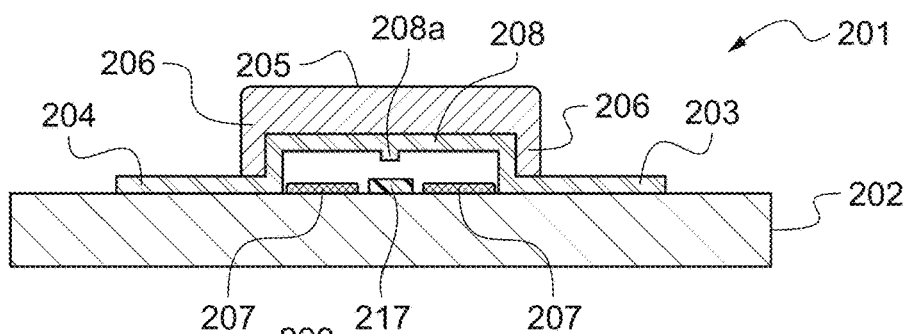
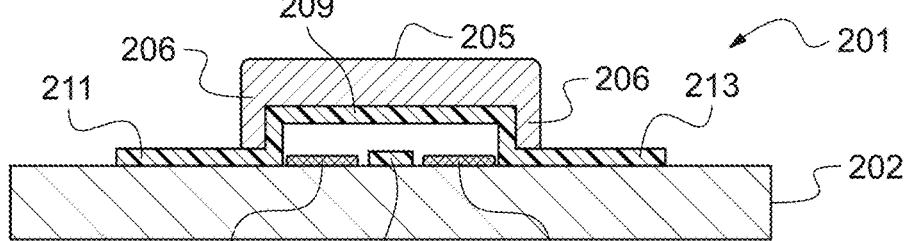
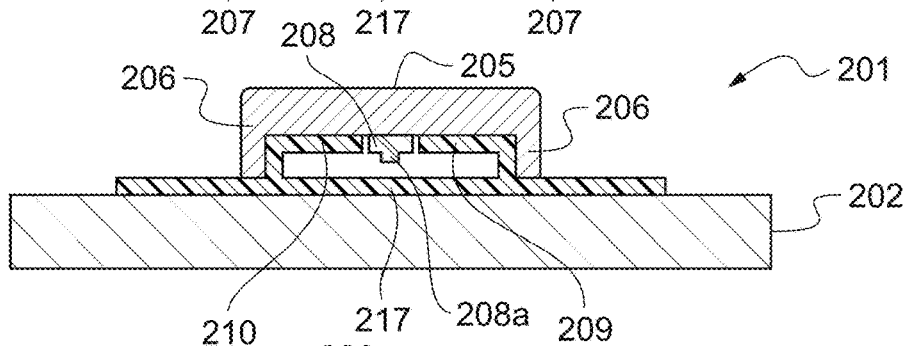
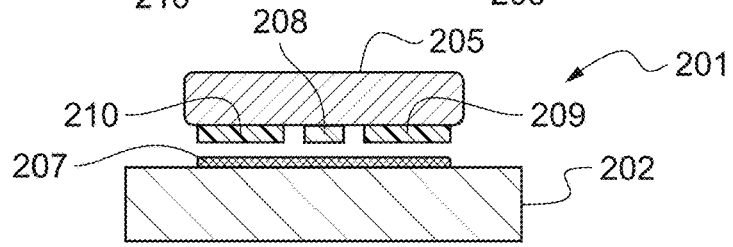

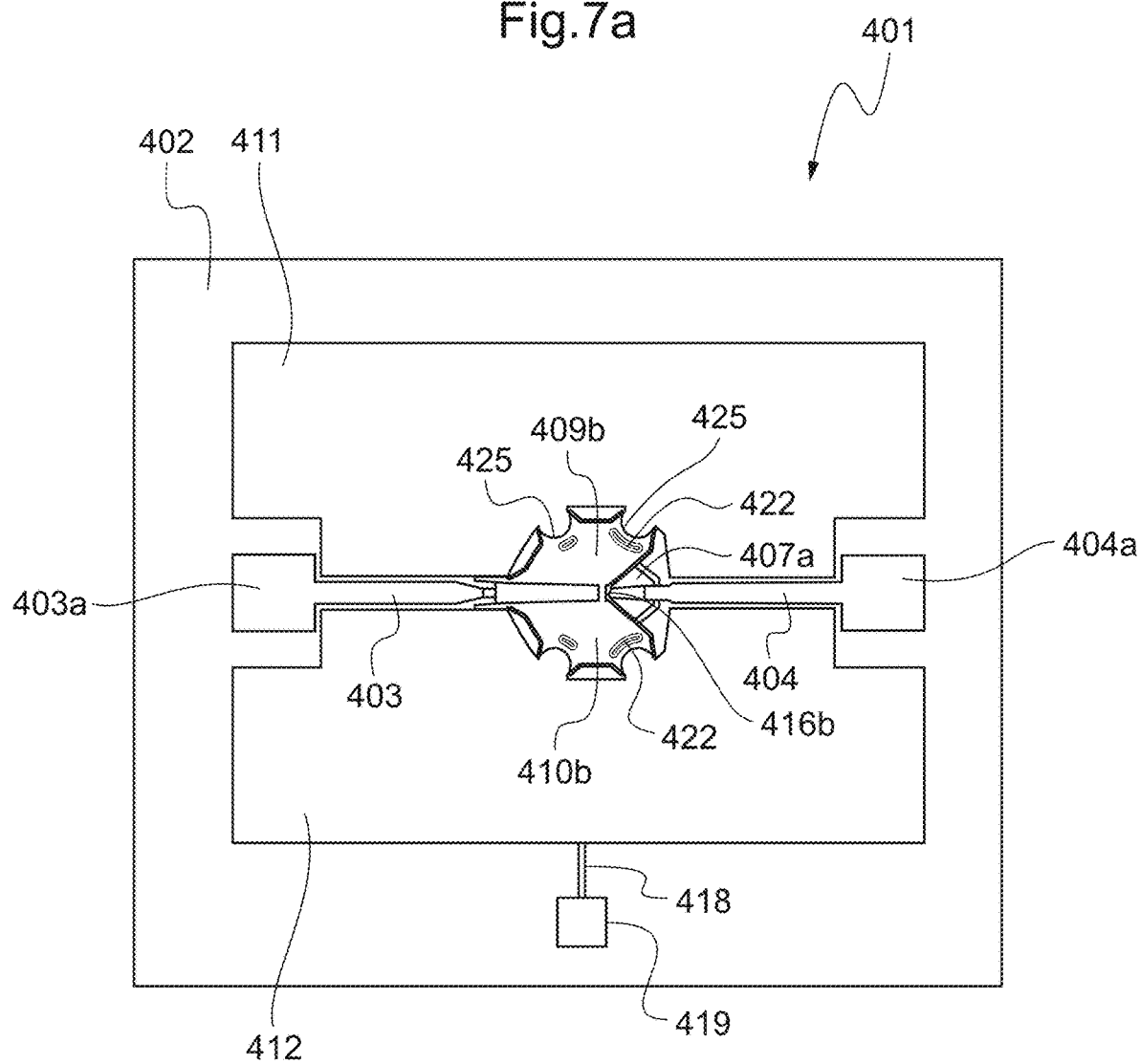

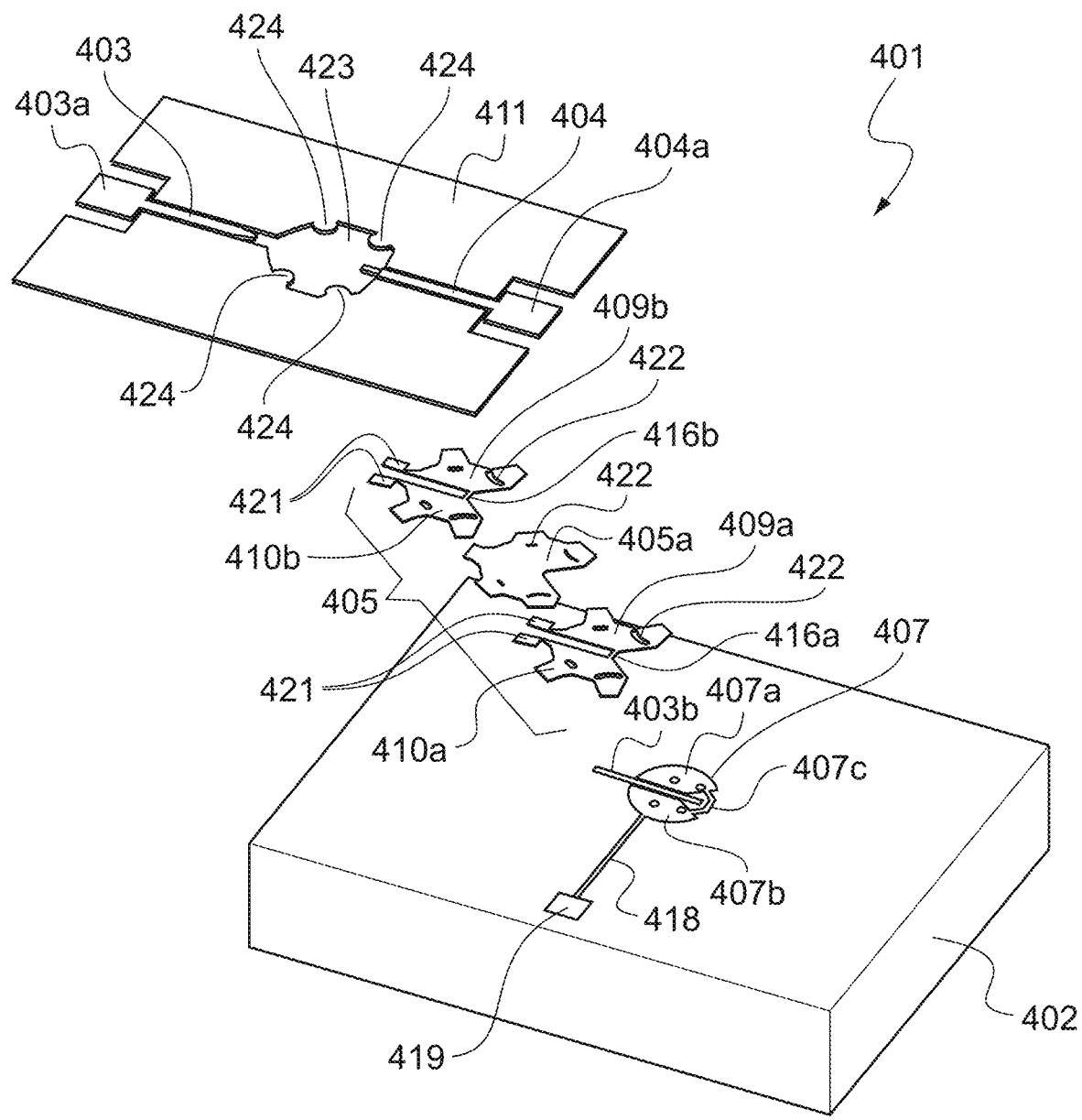

MEMS MEMBRANE WITH INTEGRATED TRANSMISSION LINE

CROSS-REFERENCE TO RELATED APPLICATION

This application is the U.S. National Phase of PCT International Application No. PCT/FR2017/051239 filed May 19, 2017, which claims priority from French Application No. 1654615 filed May 24, 2016.

FIELD OF INVENTION

The present invention relates to the field of radiofrequency micro-electromechanical systems (MEMS), referred to using the acronym RF MEMS.

BACKGROUND

Radiofrequency micro-electromechanical systems (RF MEMS) make it possible to perform switching operations for applications addressing a wide range of frequencies (DC-200 GHz).

Generally speaking, this type of component is designed in coplanar or microstrip technology with a characteristic impedance of 50 or 75 ohms in order to provide optimal guiding of the wave over the entire chip. However, limiting stray effects and keeping the RF adaptation of the MEMS membrane at high frequencies (>20 GHz) imposes technological constraints.

Indeed, the state of the art in RF MEMS presents the mechanical membrane as being:
- either entirely made from metal or covered with metal, therefore entirely conductive. In this case, stray capacitances created between the inputs and outputs of the switch often result in a frequency limitation. Furthermore, in a coplanar serial configuration, the RF grounds arranged on the substrate are generally made larger or narrower at the MEMS membrane in order to improve the adaptation, but are not sufficient to guarantee good performance at high frequencies;
- or partially metallic. In this case, it is often made up of a conductive line making it possible to convey RF signals and one or several electrodes allowing the activation of the MEMS. Thus, in the majority of cases the RF ground is brought onto the substrate, below the membrane, opposite the activation electrodes. This configuration makes it possible to reach high frequencies, but limits the activation surface and therefore requires designing a larger membrane to guarantee a high contact force (greater than 100 µN) and therefore good reliability. Furthermore, this type of component is always presented in series and may be difficult to implement in a parallel configuration.

The Applicant proposes to resolve these problems by arranging the RF ground at the MEMS membrane. This configuration has the advantage of being able to keep the RF performance at high frequencies (>50 GHz), preserve an activation force of the MEMS relative to more than 90% of the mechanical surface of the membrane in most cases, improve the power behavior by controlling the circulation of the currents on the membrane and allow simple integration of the component in a parallel configuration without affecting the mechanical properties of the membrane.

SUMMARY OF THE INVENTION

The present invention therefore relates to a micro-electromechanical switch (MEMS) formed on a substrate, the micro-electromechanical switch comprising:
- a first RF signal line and a second RF signal line formed on the substrate;
- a deformable membrane made from a highly resistive material, the membrane being kept, in a non-deformed state, spaced away from the substrate by anchoring means secured to the substrate,
- an activation means configured to deform the membrane from its nondeformed state,
- a substrate track formed on the substrate, opposite the membrane,
- a membrane track integrated into the membrane and bearing a conductive contact zone opposite the substrate track configured to produce a conductive contact between the substrate track and the membrane track in a deformed state of the membrane, the first RF signal line and the second RF signal line being connected by means of at least one from among the membrane track and the substrate track, the switch being in the on state when a signal is capable of circulating from the first RF signal line to the second RF signal line, and in the off state when a signal cannot circulate from the first RF signal line to the second RF signal line, characterized in that an membrane RF ground is integrated into the membrane, the membrane RF ground being electrically connected to an RF substrate ground by means of anchors, the membrane RF ground framing and being formed parallel to at least one from among the membrane track and the substrate track, such that the RF ground closely follows the RF signal path, to guide the propagation of the RF signal from the first RF signal line to the second RF signal line when the switch is in the on state.

One thus provides guiding of the RF signal in the component, irrespective of its configuration: serial or parallel.

It should be noted that the serial configuration is the configuration in which the switch allows the passage of the RF currents from the input to the output when it is activated. Conversely, a switch in the parallel configuration will redirect the currents toward the RF ground once activated.

It should also be noted that the RF ground is different from the DC ground of the switch. The RF ground is defined as being one from among a line or set of conductive lines bearing an electric reference potential with respect to the electric signal potential, arranged along the radiofrequency signal line and allowing the guiding of the radiofrequency wave from the input toward the output of the device. The RF ground line provides an electrical continuity of the RF input line toward the RF output line. The arrangement of the RF ground with respect to the signal line determines the characteristic impedance of the waveguide.

The DC ground is in turn defined as one from among a line or a set of conductive lines conveying an electric reference potential with respect to the electric potential necessary to activate the component. The RF ground line and the DC ground line can represent the same conductive line. Nevertheless, the DC ground line alone cannot locally guide the RF signal from the input toward the output of the device.

The verb "frame" is used in the present application broadly, i.e., the membrane RF ground can be situated, for the membrane track, above, on either side, below, or a combination of the three, relative to the membrane track. Coplanar RF ground configurations (acronym CPW or CPWG for coplanar waveguide), microstrip, stripline or surface integrated waveguide (SIW) can be indicated as configurations in which the membrane RF ground frames the membrane track. It should be noted that in the case where the RF ground lines frame the substrate line, the membrane RF ground is configured such that its projection in the plane of the substrate track is located on either side of the substrate track.

The first RF signal line may be one from among the RF signal input line and the RF signal output line of the switch, the second RF signal line being the other from among the RF signal input line and the RF signal output line of the switch.

The deformable membrane may be kept spaced away from the substrate by one or several anchors formed on at least one from among the substrate and any other micromechanical structure formed on the substrate. The deformable membrane, in its nondeformed state, is generally substantially parallel to the substrate.

The activation means may be at least one from among an electrostatic activation means, a piezoelectric activation means, a thermal activation means and an induction activation means.

In the present invention, the switch, if it uses electrostatic actuation, may have a separation between the lower face of the membrane and the activation means that is dielectric-less or with air gap, i.e., there is no dielectric between the activation electrode and the membrane.

In the present application, the membrane made from a highly resistive material refers to a dielectric or semiconductor membrane.

The membrane is thus preferably a dielectric material, but may be a highly resistive or semiconductor material.

In the present application, the term dielectric refers to one or several layers of different materials, separating several conductive elements and electrically insulating said conductive elements.

The dielectric may in particular be a material with an electric resistance greater than $5 \times 10^4$ Ohms·cm, for example $SiO_2$, SiN, $Si_3N_4$, AlN, $Al_2O_3$ or GaN.

When the membrane is made up of a semiconductor or highly resistive material, the latter may be a material with an electric resistance between $5 \times 10^2$ and $5 \times 10^3$ Ohms·cm, for example SiGe, Silicon or AsGa.

The RF grounds, the RF signal lines and the membrane and substrate tracks may be made from any metal, preferably being made from gold, copper, aluminum or tungsten, or an alloy of these metals.

The activation electrode may also be made from any metal, a resistive material such as SiCr, or nickel-doped carbon, doped silicon, TiW.

In the present application, the signal is considered not to circulate if the output signal is attenuated by at least 15 dB relative to the input signal. Thus, if the RF signal is insulated by 15 dB or more between the first RF signal line and the second RF signal line, it is considered that the RF signal does not circulate between these two lines. On the contrary, if the RF signal is insulated by less than 15 dB, the RF signal will be considered to circulate between these two lines.

The substrate may be dielectric or semi-conductive. It may in particular and non-limitingly involve one or several layers with a base of quartz, $SiO_2$, silicon, SiGe, SiN, AlN, GaN.

According to a first embodiment corresponding to a serial MEMS configuration, the membrane track is connected at one end to the first RF signal line and the substrate track is connected to the second RF signal line, the on state of the switch being made in the deformed state of the membrane, and the off state of the switch being made in a nondeformed state of the membrane.

According to a second embodiment corresponding to a MEMS according to a first parallel configuration, the first RF signal line and the second RF signal line are connected by the membrane track, the substrate track being connected to the RF ground, the off state of the switch being made in the deformed state of the membrane, and the on state of the switch being made in the nondeformed state of the membrane.

According to a third embodiment corresponding to a MEMS in a second parallel configuration, the first RF signal line and the second RF signal line are connected by the substrate track, the membrane track being connected to the RF ground, the off state of the switch being made in the deformed state of the membrane, and the on state of the switch being made in the nondeformed state of the membrane.

According to one particular feature of the invention for the serial configuration or for the second parallel configuration corresponding to the third embodiment, the membrane RF ground may be made up of two RF ground tracks located on either side of the membrane track.

According to another particular feature of the invention for the first parallel configuration, the membrane RF ground may be made up of two RF ground tracks located on either side of the substrate track. For the substrate track, the membrane RF ground is configured such that its projection in the plane of the substrate track is located on either side of the substrate track.

According to another particular feature of the invention, the membrane track and the two RF ground tracks may be in a same plane parallel to the substrate.

According to another particular feature of the invention, the membrane RF ground may further comprise at least one from among an RF ground track located above the membrane track and an RF ground track located below the membrane track, the RF ground track of the membrane RF ground located above the membrane track extending over at least part of the width of the membrane between the anchors and the end of the membrane track connected to the contact zone, and the RF ground track and the membrane RF ground located below the membrane track extending over at least part of the width of the membrane between the anchors and the end of the membrane track connected to the contact zone, leaving the contact zone free.

Optimal guiding of the RF signal in the membrane is thus provided for the serial configuration.

The RF ground tracks of the membrane RF ground can be connected by vias in the membrane formed on either side of the conductive track.

According to another particular feature of the invention, the contact zone of the membrane is a contact pin protruding from the lower face of the membrane to provide conductive physical contact of the contact pin with the substrate track in the deformed state of the membrane.

The contact pin may advantageously be made up of one from among a metal from the platinum group, the oxides of a metal from the platinum group or combinations thereof.

According to another particular feature of the invention, the membrane RF ground is on the lower face of the membrane, opposite the substrate.

The micro-electromechanical switch may further comprise at least one from among a second membrane track and a second membrane RF ground that are formed symmetrically to the membrane track relative to a plane parallel to the substrate and median along the thickness of the membrane, and the second RF ground being symmetrical to the membrane RF ground relative to a plane parallel to the substrate and median along the thickness of the membrane.

This configuration thus makes it possible to limit the temperature deflections of the membrane caused by the thermal expansion differences of the component materials of the membrane.

According to one particular configuration of the invention, the first RF signal line and the second RF signal line are coplanar, the membrane is rounded, kept spaced away from the substrate by five anchors formed on the substrate, the electrostatic actuation means being made up of an electrostatic activation electrode formed on the substrate opposite the membrane and supplied by an activation line, the activation electrode being configured, when it is activated by the activation line, to bring the membrane to its deformed state.

The micro-electromechanical switch according to the invention may in particular be made by a series of deposition and etching operations of thin layers of materials. The depositions are done by deposition devices known in the field of microelectronics (thermal evaporators, electron guns, DC and RF cathode stutters, laser ablation, etc.). The etching of the materials can be assisted by photolithography methods making it possible to define patterns. The etching can be done using chemical solutions (for example, hydrofluoric acid, hydrochloric acid, tetra methyl ammonium hydroxide (TMAH), etc.) or using $O_2$, $CF_4$ or $SF_6$ plasmas, etc.

To better illustrate the subject matter of the present invention, we will describe one particular embodiment below, by way of non-limiting illustration, in reference to the appended drawings.

BRIEF DESCRIPTION OF THE DRAWINGS

In these drawings:

FIGS. 5, 5a, 5b, 5c and 5d are respectively a schematic top view, a longitudinal sectional view along line AA', a longitudinal sectional view along line BB', a cross-sectional view along line CC' and a cross-sectional view along line DD' of FIG. 5 of a micro-electromechanical switch (MEMS) according to a third embodiment of the invention;

FIGS. 7a and 7b are respectively a top view and an exploded perspective view of one embodiment of the micro-electromechanical switch (MEMS) according to the second embodiment of the invention.

FIGS. 1, 1a, 1b and 1c show a first alternative of a micro-electromechanical switch 1 according to a first embodiment of the invention, this first embodiment corresponding to a so-called serial configuration.

DETAILED DESCRIPTION OF THE INVENTION

The micro-electromechanical switch 1 comprises a substrate 2, on the upper surface of which a first RF signal line 3 and a second RF signal line 4 aligned with the first RF signal line 3 are formed, the first RF signal line 3 and the second RF signal line 4 having the same direction. One of the first RF signal line 3 and the second RF signal line 4 constitutes the input RF signal line of the micro-electromechanical switch 1, the other of the first RF signal line 3 and the second RF signal line 4 constituting its output RF signal line.

A deformable membrane 5, which may be dielectric or semi-conductive, is kept spaced apart from the substrate 2 by two anchors 6. The membrane 5 will be assumed to be dielectric in the embodiments below, but is not limited thereto.

Figure 1:
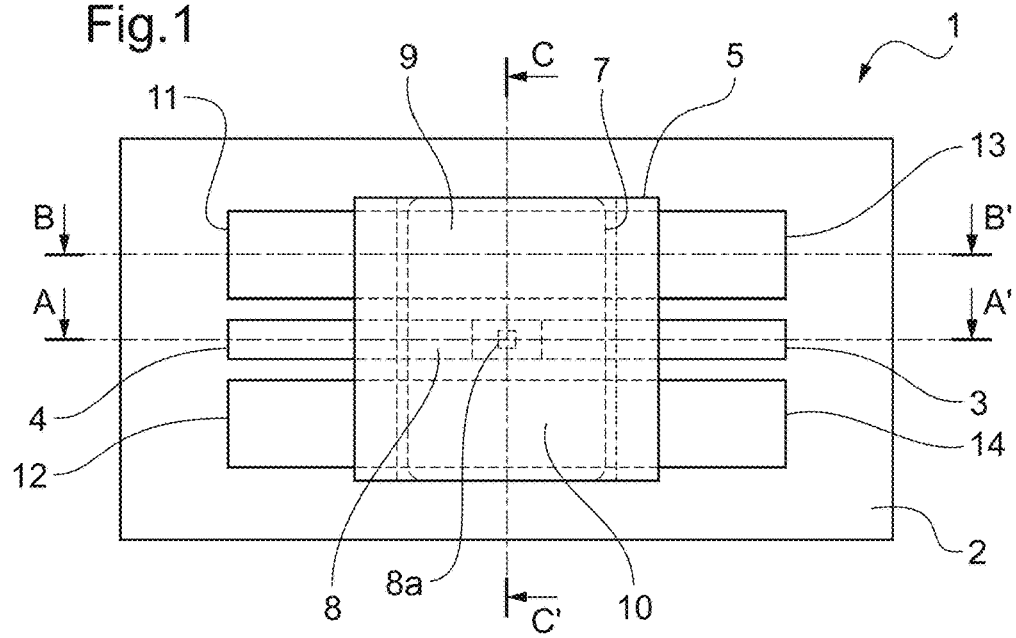
FIGS. 1, 1a, 1b and 1c are respectively a schematic top view, a longitudinal sectional view along line AA', a longitudinal sectional view along line BB' and a cross-sectional view along line CC' of FIG. 1 of a micro-electromechanical switch (MEMS) according to a first alternative of a first embodiment of the invention.
Figure 1A:
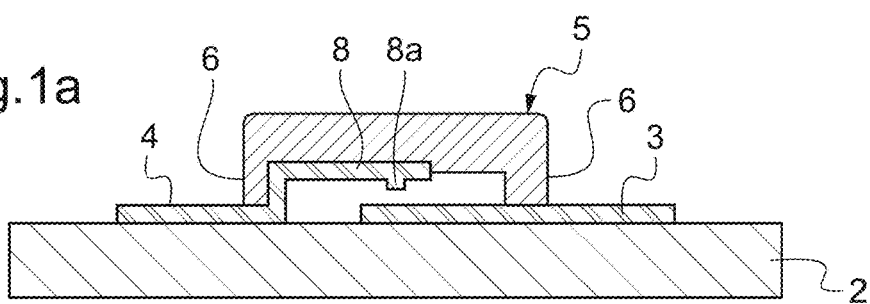
Figure 1B:
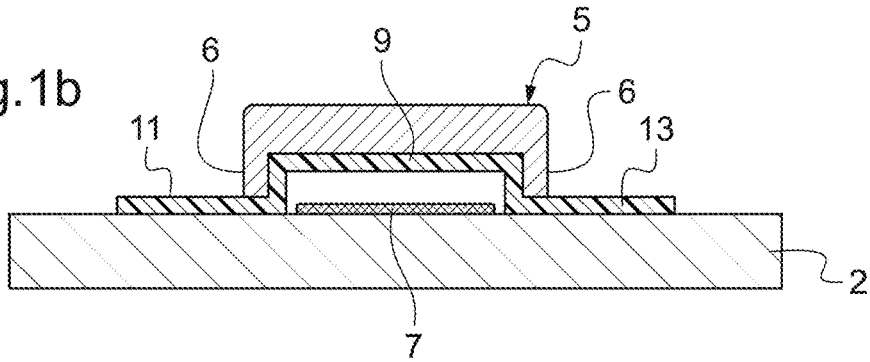
Figure 1C:
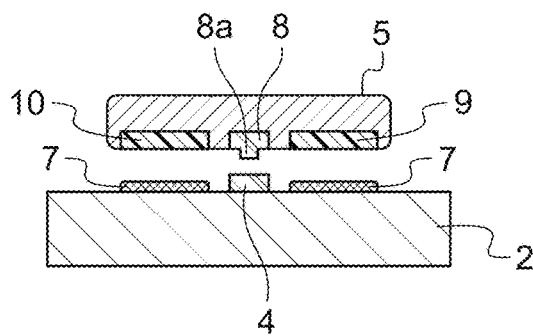

The dielectric deformable membrane 5 is deformable between a first, so-called nondeformed position, in which the dielectric membrane 5 is as shown in FIG. 1a, kept parallel or substantially parallel to the substrate 2 by the anchors 6 above the substrate 2, and a so-called deformed position, described in more detail hereinafter.

An activation electrode 7, made up of two portions, is arranged below the dielectric membrane 5, and when the activation electrode 7 is powered (power supply not shown in the schematic illustration of the Figures), it attracts the dielectric membrane 5 to cause it to adopt its deformed state. Although the activation shown in the figures is an electrostatic activation, the activation may be an electrostatic activation, a piezoelectric type activation, a thermal activation or an induction activation, the invention not being limited in this respect.

A membrane track 8 is formed in the dielectric membrane 5, said membrane track 8 in this first embodiment being connected via the anchor 6 to the second RF signal line 4 and having a projection 8a in the form of a pin under the dielectric membrane 5, said projection 8a being intended to come into contact with the first RF signal line 3 in the deformed state of the dielectric membrane 5, so that an RF signal can go from the first RF signal line 3 to the second RF signal line 4 via the membrane track 8 in the deformed state of the dielectric membrane 5, and not go from the first RF signal line 3 to the second RF signal line 4 in the nondeformed state of the dielectric membrane 5, so as to make up an electrostatic switch 1 commanded by activation of the activation electrode 7.

Membrane RF grounds 9 and 10 are also formed in the dielectric membrane 5, parallel to the membrane track 8 and in the same plane as the latter, and are connected by means of anchors 6 to RF grounds 11, 12, 13 and 14 formed on the substrate 2, parallel to the first and second RF signal lines 3 and 4 and in the same plane as the latter.

All of the RF grounds 9, 10, 11, 12, 13, 14 and the signal lines 3 and 4 thus form a waveguide for an RF signal moving, in the deformed state of the dielectric membrane 5, between the first RF signal line 3 and the second RF signal line 4, the RF grounds 13 and 14 making-up a waveguide for the RF signal on the first RF signal line 3, the RF grounds 9 and 10 making-up a waveguide for an RF signal moving over the membrane track 8, and the RF grounds 11 and 12 making-up a waveguide for an RF signal moving over the second RF signal line 4, the RF signal thus being guided all throughout its passage through the micro-electromechanical switch 1.

It should be noted that, without departing from the scope of the present invention, the RF signal could symmetrically move in the direction from the second RF signal line 4 to the first RF signal line 3, the movement direction indicated in connection with the description of FIGS. 1, 1a, 1b and 1c above being intended solely to illustrate the operation of the micro-electromechanical switch 1 and not being intended to limit the invention in this respect.

The RF grounds 11, 12, 13 and 14 also constitute DC grounds making it possible to establish a potential difference with the electrode which, once polarized, will activate the micro-electromechanical switch 1.

Figure 2A:
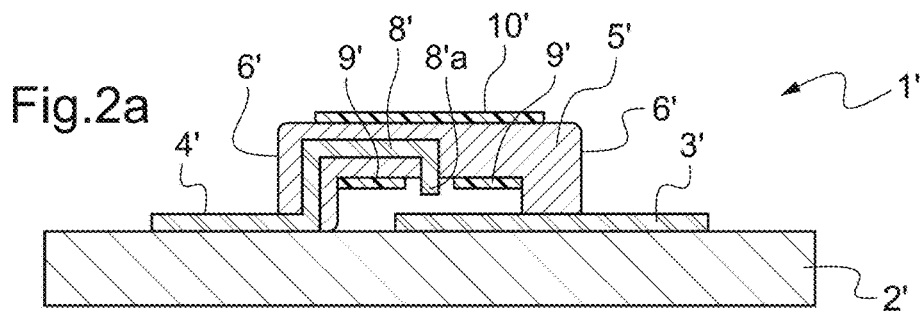
FIGS. 2a, 2b and 2c are respectively a schematic longitudinal sectional view along line AA', longitudinal sectional view along line BB' and a cross-sectional view along line CC' similar to that of FIG. 1 of a micro-electromechanical switch (MEMS) according to a second alternative of the first embodiment of the invention.
Figure 2B:
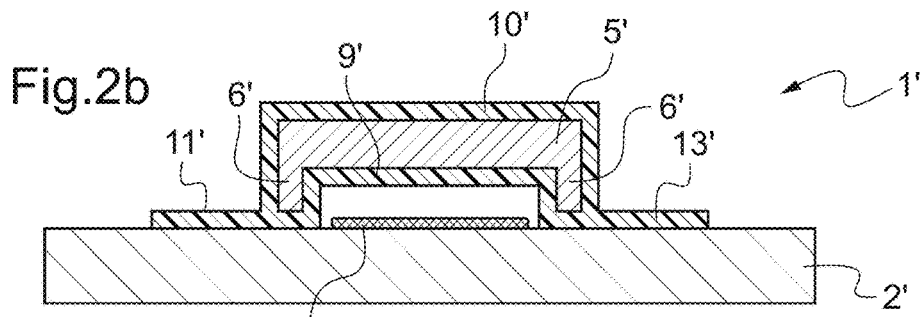
Figure 2C:
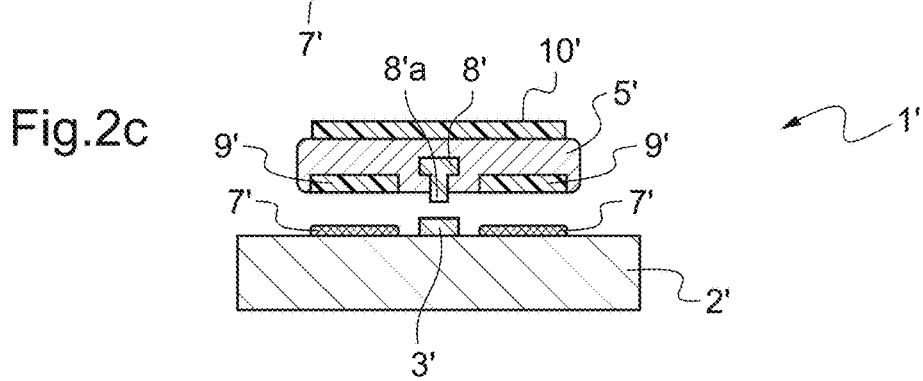

FIGS. 2a, 2b and 2c show a micro-electromechanical switch 1' according to a second alternative of the first embodiment.

The top view of this second alternative of the first embodiment is not shown due to the number of layers, which would make the figure difficult to read. The section lines AA', BB' and CC' are, however, similar to those of FIG. 1 and therefore respectively correspond to a median longitudinal section, a lateral longitudinal section and a median cross-section of the micro-electromechanical switch 1' according to the second alternative of the first embodiment.

The elements that are identical to the elements of the first alternative of the first embodiment described in reference to FIGS. 1, 1a-1c bear the same reference numeral followed by the "'" symbol and will not be described in detail when they have the same structure as in the first alternative of the first embodiment.

In this second alternative of the first embodiment, the substrate 2' bears, like in the first alternative of the first embodiment, the RF grounds 11' and 13', as well as the activation electrode 7' (the other RF grounds corresponding to the RF grounds 12 and 14 of FIG. 1 are not shown so as not to multiply the number of Figures, but are also of course present in this second alternative of the first embodiment).

The difference with respect to the first alternative lies in the position of the membrane RF grounds 9' and 10'. Thus, in the second alternative, a first membrane RF ground 9' is formed on the lower face of the dielectric membrane 5', across from the surface of the substrate 2' bearing the activation electrode 7', and a second membrane RF ground 10' is formed on the upper face of the dielectric membrane 5', the membrane track 8' extending between two membrane RF grounds 9' and 10', between one of the anchors 6' and substantially the center of the dielectric membrane 5', the projection 8a', connected to the membrane track 8', protruding like in the first alternative of the first embodiment below the dielectric membrane 5', opposite the first RF signal line 3', in an opening formed in the membrane RF ground 9'.

The membrane RF ground 10' extends over the entire upper surface of the dielectric membrane 5', the membrane RF ground 9' extending only over a portion of the lower surface of the dielectric membrane 5', so as to allow the projection 8a' to open out onto the lower surface of the dielectric membrane 5' at the end thereof to produce an electric contact with the first RF signal line 3' in the deformed state of the dielectric membrane 5'.

Figure 3A:
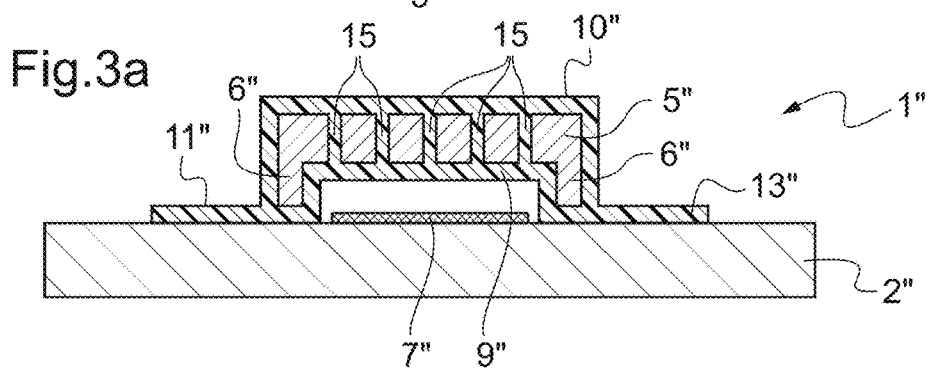
FIGS. 3a and 3b are schematic views similar to FIGS. 2b and 2c of a micro-electromechanical switch (MEMS) according to a third alternative of the first embodiment of the invention.
Figure 3B:
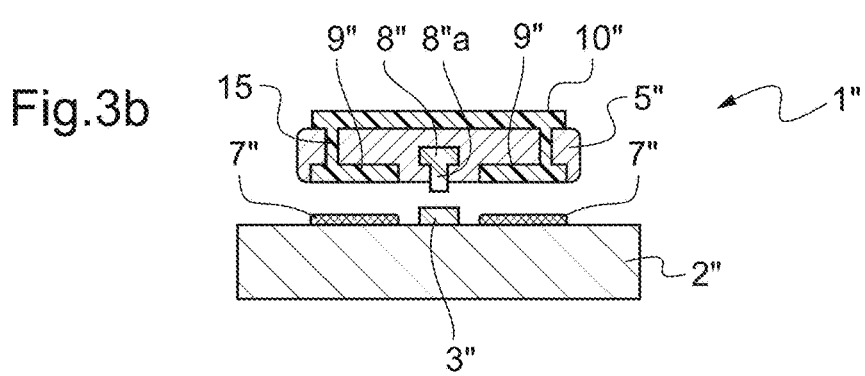
Figure 4:
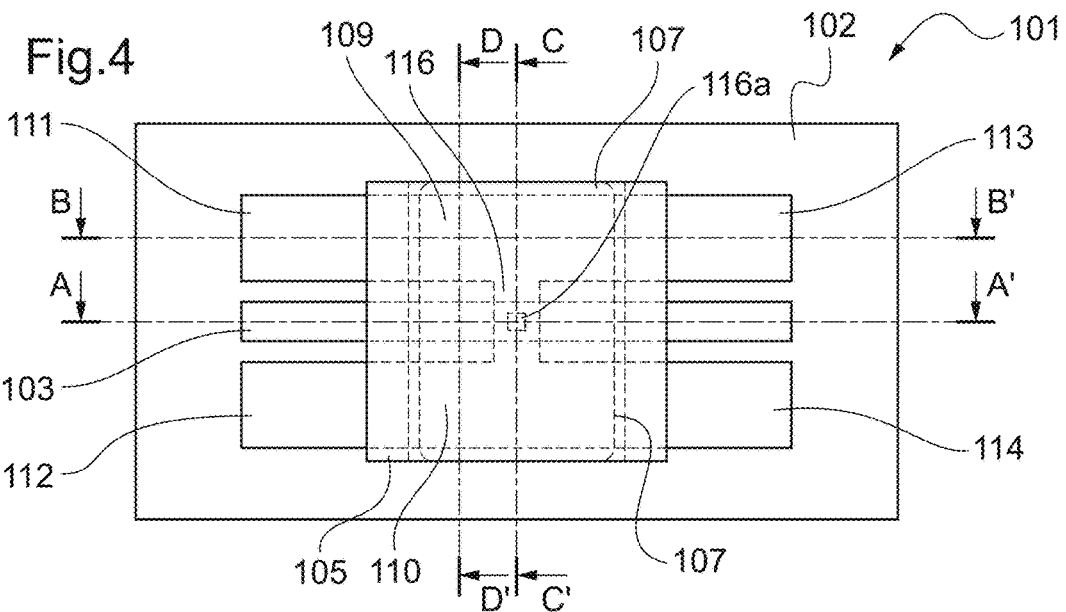
FIGS. 4, 4a, 4b, 4c and 4d are respectively a schematic top view, a longitudinal sectional view along line AA', a longitudinal sectional view along line BB', a cross-sectional view along line CC' and a cross-sectional view along line DD' of FIG. 4 of a micro-electromechanical switch (MEMS) according to a second embodiment of the invention.
Figure 4A:
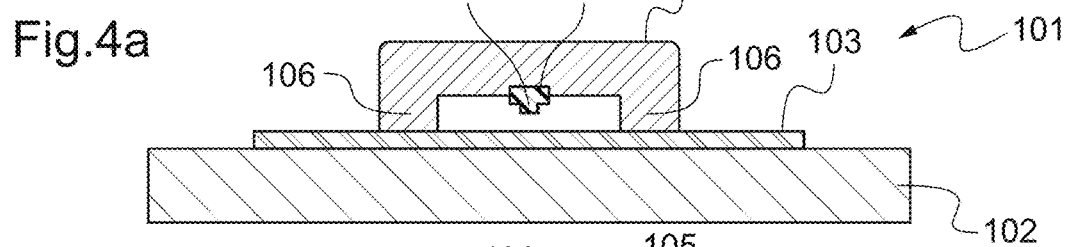
Figure 4B:
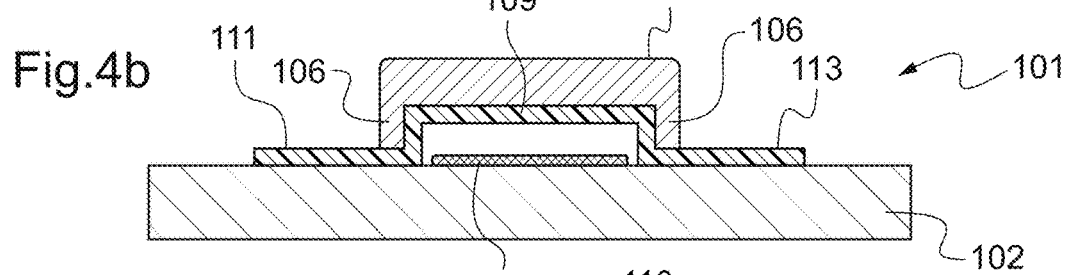
Figure 4C:
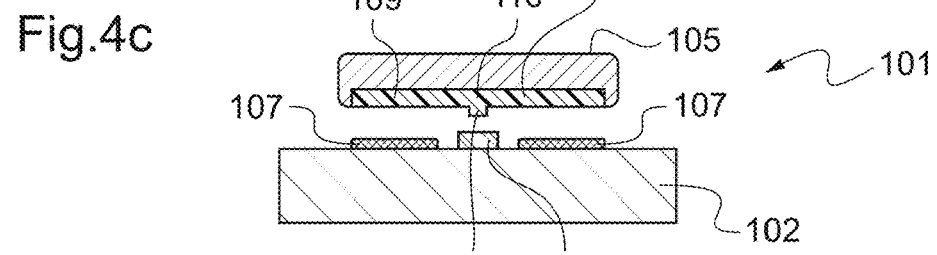
Figure 4D:
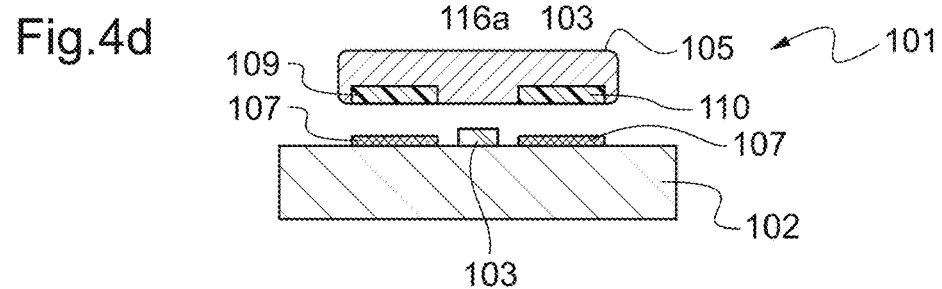

The third alternative of the first embodiment shown in FIGS. 3a and 3b is identical to the second alternative, and the identical elements bear the same reference numeral as in FIGS. 2a, 2b and 2c, followed by a new symbol """.

The structure and position of the elements being the same as in FIGS. 2a, 2b and 2c, these will not be described in detail when their structure does not change. The difference between the second and third alternatives of the first embodiment lies in the presence of vias 15 between the first and second membrane RF grounds 9" and 10", allowing improved wave guiding for the RF signal circulating in the membrane 5" on the membrane track 8", relative to the first alternative.

Other alternatives not described so as not to multiply the number of figures fall within the scope of the present invention. It may thus be considered to have, as membrane RF ground, only an RF ground similar to the second RF ground 10' of the second alternative of the first embodiment, or only an RF ground similar to the first RF ground 9' of the second alternative of the first embodiment, or a combination of RF grounds of the first and second alternatives, i.e., two RF grounds framing the membrane track like the RF grounds 9 and 10 of FIGS. 1a-1c, and two RF grounds below and above the membrane track like in FIG. 2a-2b-2c, with or without vias like in FIGS. 3a and 3b. All of these alternatives fall within the scope of the present invention, without the invention being limited thereto.

FIGS. 4, 4a-4c show a micro-electromechanical switch 101 according to a second embodiment of the invention, called first parallel configuration. The elements that are identical or similar to the elements of the first alternative of the first embodiment bear the same reference numeral increased by 100, and will not be described in more detail here.

In this second embodiment, the micro-electromechanical switch 101 comprises, arranged on the substrate 102, a substrate track 103, extending transversely below the dielectric membrane 105, substantially along the median of the dielectric membrane 105, the substrate track 103 transporting, in this second embodiment, the RF signal through the micro-electromechanical switch 101.

Upstream and downstream from the dielectric membrane 105, four RF grounds 111, 112, 113 and 114 are formed on the substrate 102, the upstream RF grounds 113 and 114 stopping at the anchor 106 of the membrane, the downstream RF grounds 111 and 112 starting from the end of the dielectric membrane 105, the role of these RF grounds 111, 112, 113 and 114 being to form a waveguide for the RF signal on the substrate track 103, upstream and downstream from the dielectric membrane 105, the grounds 113 and 114 alone making up the DC ground necessary for activation.

Between the RF grounds 111, 112, 113 and 114, still on the substrate 102 and below the dielectric membrane 105, an activation electrode 107 (in two parts like in the first embodiment) is formed on either side of the substrate track 103, in order to deform the dielectric membrane 105. The activation electrode 107 can be made up of two elements powered separately or as a single element, the connection between the two elements on either side of the substrate track 103 then being made in the substrate 102.

In the membrane 105, two membrane RF grounds 109 and 110 are formed, extending in the membrane 105 parallel to the substrate track 103, on either side thereof such that the projections of the membrane RF grounds 109 and 110 in the plane of the substrate track 103 are on either side of the substrate track 103 and parallel thereto.

The membrane RF grounds 109 and 110 are connected to the RF grounds 111 and 112 by means of anchors 106 and are connected substantially in their middle by a bridge 116.

In the embodiment shown in FIGS. 4, 4a-4c, the membrane RF grounds 109 and 110 are formed on the lower surface of the dielectric membrane 105, such that their lower surface opens below the dielectric membrane 105. Thus, in this embodiment, the bridge 116 also opens below the dielectric membrane 105 and makes it possible, during a deformation of the dielectric membrane 105 by the activation electrode 107, to short-circuit the RF signal that circulates on the substrate track 103, by means of the projection 116a similar to the projection 8a of FIG. 1a.

It should be noted that it is also possible to consider that the membrane RF grounds 109 and 110 are completely embedded in the dielectric membrane 105, in which case it would be necessary for the projection 116a, connected to the bridge 116, to protrude over the lower surface of the dielectric membrane 105 in order to allow electric contact with the substrate track 103.

In this embodiment like in all of the other embodiments, the contact of the dielectric membrane in its deformed state with an element on the substrate may be either by direct contact of the lower surface of the dielectric membrane with the element on the substrate, or by means of a projection or a pin formed on the lower surface of the dielectric membrane and protruding therefrom, the pin being connected in the dielectric membrane with the element that must be placed in contact with the element on the substrate.

Thus, unlike the first embodiment in which the RF signal passes through the micro-electromechanical switch by passing through the dielectric membrane when the latter is deformed, in the second embodiment the RF signal passes through the micro-electromechanical switch when the dielectric membrane is not deformed, and is short-circuited when the dielectric membrane is deformed.

FIGS. 5, 5a-5c show a micro-electromechanical switch 201 according to a third embodiment of the invention, called second parallel configuration. The elements that are identical or similar to the elements of the first alternative of the first embodiment bear the same reference numeral increased by 200, and will not be described in more detail here.

In this third embodiment, the micro-electromechanical switch 201 comprises, arranged on the substrate 202, a first RF signal line 203, a second RF signal line 204 parallel to the first RF signal line 203 and in the extension thereof.

RF substrate grounds 213 and 214 formed on the substrate 202 are formed parallel to the first signal line 203 and parallel thereto, while the RF substrate grounds 211 and 212 are formed parallel to the second signal line 204 and parallel thereto.

The dielectric membrane 205 is kept spaced away from the substrate 202 by two anchors 206 located on two opposite sides of the dielectric membrane 205, the dielectric membrane 205 bearing a membrane track 208 and two RF grounds 209 and 210, located on either side of the membrane track 208 and in the same plane as the latter. The membrane track bears a projection 208a oriented toward the substrate 202, in order to produce an electric contact in the deformed state of the dielectric membrane 205, like the projection 8a of the first embodiment (first alternative).

The membrane track 208 is respectively connected to the first and second RF signal lines 203 and 204 by means of anchors 206, such that in the non-deformed configuration of the dielectric membrane 205, the RF signal passes through the micro-electromechanical switch 201 from the first RF signal line 203 to the second RF signal line 204 (or in the other direction) by means of the membrane track 208. The two membrane RF grounds 209 and 210 are in turn connected by means of anchors 206 to the RF substrate grounds 211, 212, 213 and 214.

Two activation electrodes 207 are formed parallelly below the dielectric membrane 205, transversely to the direction of the membrane track 208, and serve, like in the other embodiments, to deform the dielectric membrane 205. Like the other embodiments, the power supply of the activation electrodes 207 is omitted so as not to overload the figure.

Between the two activation electrodes 207, on the substrate 202, a ground track 217 is formed, parallel to the other two activation electrodes 207 and therefore orthogonal to the direction of the membrane track 208, such that the projection of the center of the membrane track 208 in the plane of the ground track 217 substantially corresponds to the center of the ground track 217. The ground track 217 is connected by means of the anchors 206 to the membrane RF grounds 209 and 210.

Like for the other embodiments, although the membrane track 208 is shown schematically as having a surface (lower surface) opening out directly below the surface of the dielectric membrane 205, it may be considered, without departing from the scope of the present invention, that the membrane track 208 is embedded in the dielectric membrane 205, connected by a via to the lower surface of the dielectric membrane 205 and the projection 208a, so as to produce a contact with an element on the substrate.

The two activation electrodes 207, conjugated with the symmetry of the anchors 206 on either side of the dielectric membrane 205, cause a deformation of the dielectric membrane 205 at its center, such that the projection 208a in this embodiment is located below the dielectric membrane 205, directly above with the center of the RF ground track 217.

Like in the second embodiment, the deformed state of the dielectric membrane 205 corresponds to a short-circuit and therefore to an RF signal passage stop through the micro-electromechanical switch 201, and the nondeformed state of the dielectric membrane 205 corresponds to the passage of the RF signal through the switch 201, with the difference, relative to the second embodiment, that instead of passing over a track located on the substrate, the RF signal in this third embodiment passes through the dielectric membrane 205.

Figure 6A:
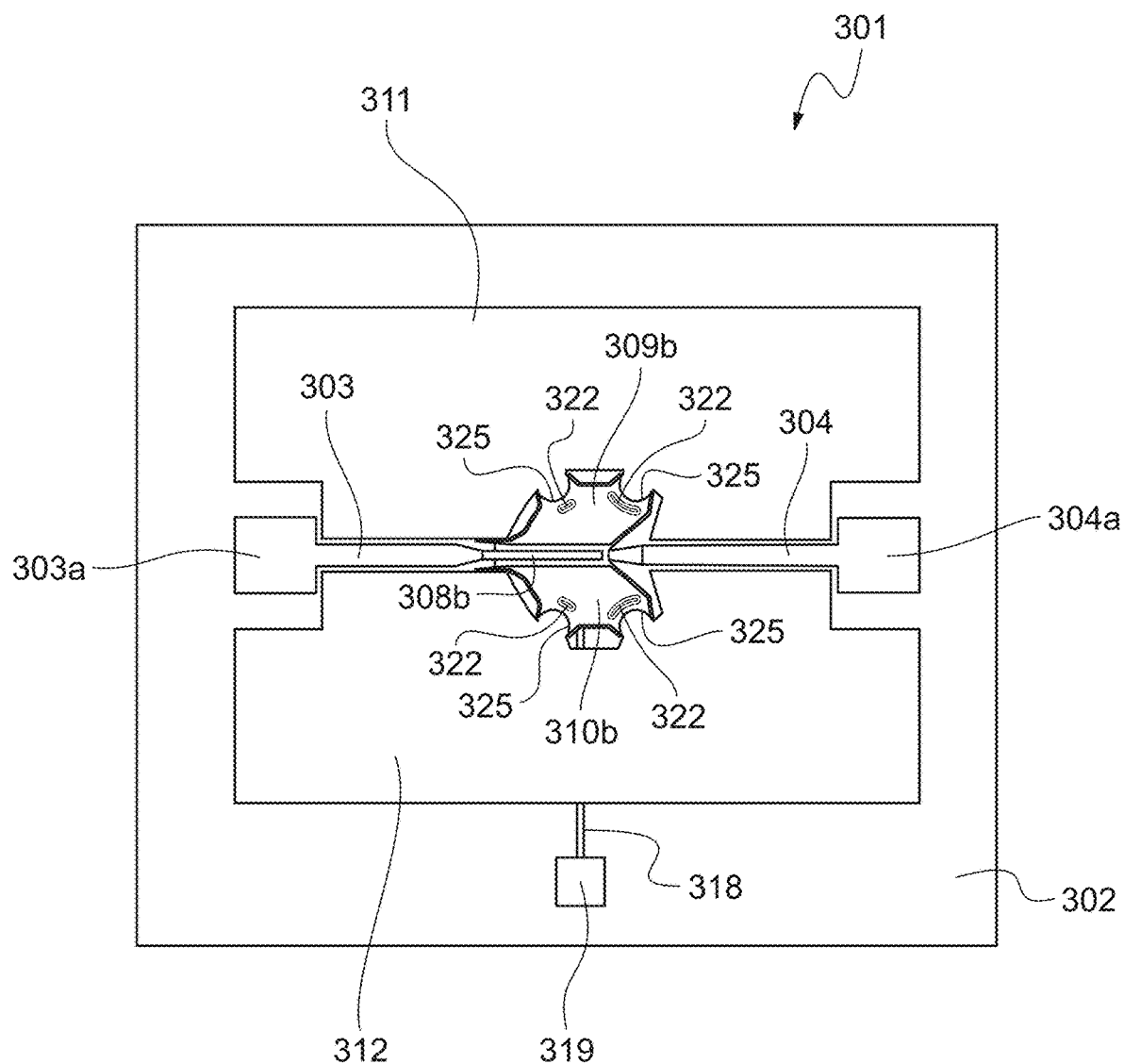
FIGS. 6a and 6b are respectively a top view and an exploded perspective view of an embodiment of a micro-electromechanical switch (MEMS) according to the first embodiment of the invention.
Figure 6B:
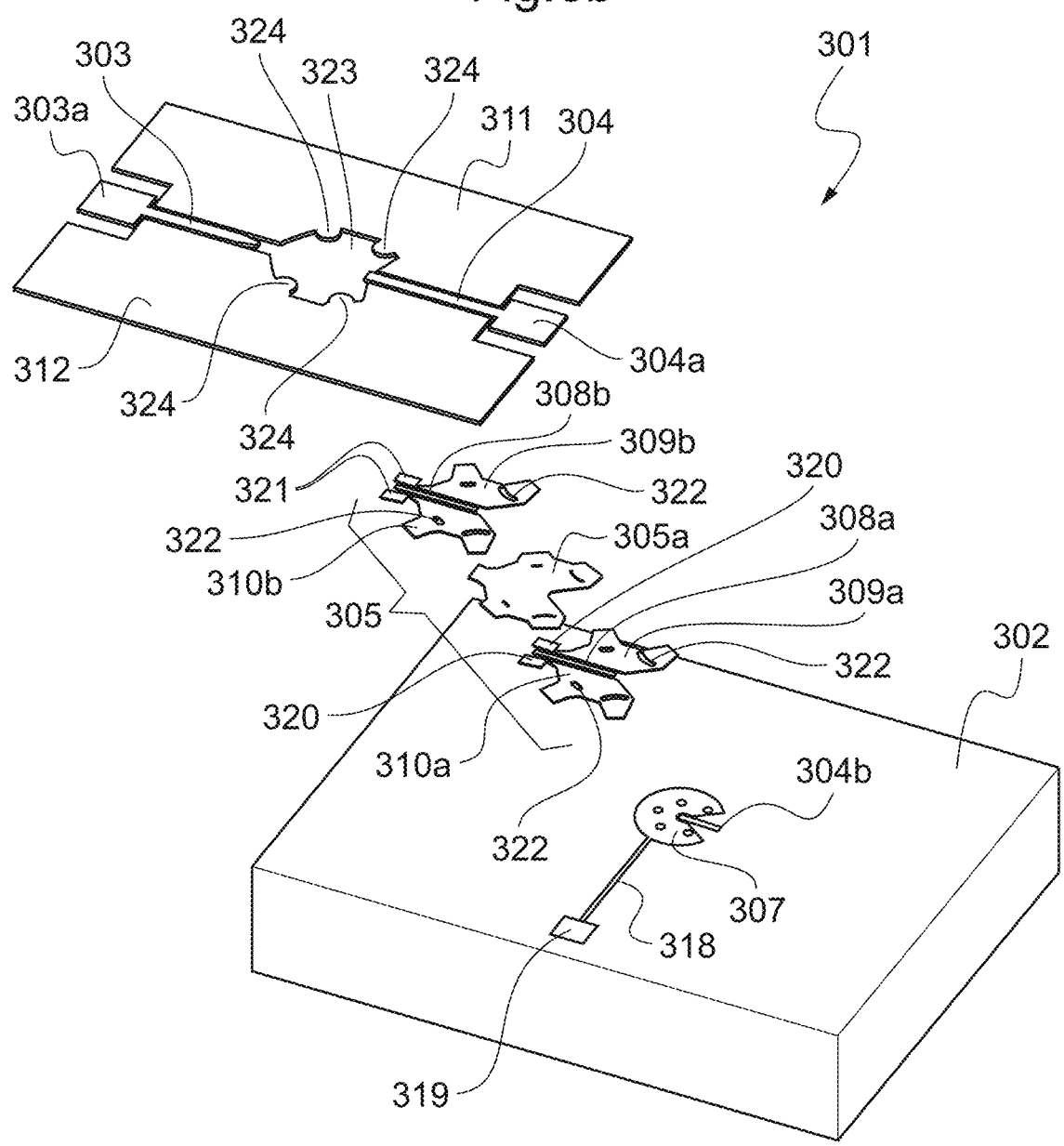

FIGS. 6a and 6b show an implementation of a micro-electromechanical switch 301 according to the first embodiment.

The elements that are common with the elements of the first alternative of the first embodiment are designated by the same reference numeral, increased by 300.

Thus formed on a substrate 302 are a first RF signal line 303 and a second RF signal line 304, respectively accessible via pads 303a and 304a.

An activation electrode 307 is also formed on the substrate 302, connected by means of a supply track 318 to a pad 319 making it possible to connect an electrical power source (not shown) in order to activate the activation electrode 307.

In this particular non-limiting embodiment of the invention, the activation electrode 307 is in the shape of a disc with one quarter removed, a substrate track 304b extending along the bisector of the missing quarter, said substrate track 304b not being in contact with the activation electrode 307, but being in contact with the second RF signal track 304 when the micro-electromechanical switch 301 is not activated.

The dielectric membrane 305 is made up of three stacked layers: a first layer (lower layer) comprising two RF ground tracks 309a and 310a framing the membrane track 308a, a dielectric layer 305a, a second layer symmetrical with the first layer, and comprising two RF ground tracks 309b and 310b framing a membrane track 308b. Pads 320 make it possible to supply power to the RF grounds 309a, 310a, 309b and 310b.

As can be seen in FIG. 6a, the complete dielectric membrane 305 has a shape substantially corresponding to the shape of the activation electrode 307, with the exception that hollows 325 are formed symmetrically on either side of a direction corresponding to the direction of the membrane track 308b, said hollows 325 corresponding to rounded protrusions of the ground tracks 311 and 312, in order to allow an optimal deformation of the dielectric membrane 305 during an activation by the activation electrode 307.

The dielectric membrane 305 is housed in the space 323 formed between the RF ground tracks 311 and 312.

The parts of the dielectric membrane 305 between the hollows 325 make up the anchors making it possible to connect the RF ground tracks 309a, 309b, 310a and 310b to the RF grounds 311 and 312, the anchor of the dielectric membrane 305 in the axis of the membrane track 308a, 308b making it possible to connect the membrane track 308a, 308b to the first RF signal line 303. Corresponding rounded protrusions 324 are formed on the RF ground tracks 311 and 312.

The holes 322 formed on the dielectric membrane 305 make it possible to optimize the deformation of the dielectric membrane 305.

Although this is not shown in FIGS. 6a, 6b, a pin preferably protrudes below the membrane track 308a, in order to guarantee contact with the substrate track 304b in the deformed state of the dielectric membrane 305, in order to have an RF signal from the first RF signal line 303 pass over the membrane track 308a, 308b, then over the second RF signal line 304.

The symmetry of the layers 309a, 310a, 308a and 309b, 310b, 308b makes it possible to limit the temperature deflections of the membrane caused by the differences in thermal expansion of the component materials of the membrane.

FIGS. 7a and 7b show an implementation of a micro-electromechanical switch 401 according to the second embodiment.

The elements that are common with the elements of the second embodiment are designated by the same reference numeral, increased by 400.

Thus formed on a substrate 402 are a first RF signal line 403 and a second RF signal line 404, respectively accessible by means of pads 403a and 404a.

An activation electrode 407 is also formed on the substrate 402, connected by means of a supply track 418 to a pad 419 making it possible to connect an electrical power source (not shown) to polarize the component and activate it.

In this particular and non-limiting implementation of the invention, the activation electrode 307 is made up of two half-discs 407a and 407b, separated by a substrate track 403b formed on the substrate 402 and symmetrical relative thereto, and one quarter of which is missing on the side of the activation electrode 407 oriented toward the second RF signal line 404 when the micro-electromechanical switch 401 is assembled.

The two half-discs 407a and 407b are connected by a track 407c formed in the free space formed by the missing quarters of the half-discs 407a and 407b, the track 407a bypassing the substrate track 403b.

The dielectric membrane 405 is made up of three stacked layers: a first layer (lower layer) comprising two RF ground tracks 409a and 410a connected by a bridge 416a, a dielectric layer 405a, a second layer symmetrical to the first layer, and comprising two RF ground tracks 409b and 410b connected by a bridge 416. Pads 421 make it possible to supply power to the RF grounds 409a, 410a, 409b and 410b.

As can be seen in FIG. 7a, the complete dielectric membrane 405 has a shape substantially corresponding to the shape of the activation electrode 407, with the exception that hollows 425 are formed symmetrically on either side of a direction corresponding to the direction of the substrate track 403a, said hollows 425 corresponding to rounded protrusions of the ground tracks 411 and 412, in order to allow an optimal deformation of the dielectric membrane 405 during activation by the activation electrode 407.

The dielectric membrane 405 is housed in a space 423 formed between the RF ground tracks 411 and 412.

The parts of the dielectric membrane 405 between the hollows 425 make up the anchors making it possible to connect the RF ground tracks 409a, 409b, 410a and 410b to the RF grounds 411 and 412. In the non-deformed state of the dielectric membrane 405, the second RF signal line is in contact with the substrate track 403b. Corresponding rounded protrusions 424 are formed on the RF ground tracks 411 and 412.

The holes 422 formed on the dielectric membrane 405 make it possible to optimize the deformation of the dielectric membrane 405.

Although this is not shown in FIGS. 7a, 7b, a pin is preferably projecting below the bridge 416a, in order to guarantee contact with substrate track 403b in the deformed state of the dielectric membrane 405, so as to produce a short-circuit of an RF signal circulating from the first RF signal line 403 to the second RF signal line 404, the RF signal circulating on the substrate track 403b being sent directly to the ground in the deformed state of the dielectric membrane 405.

The symmetry of the layers 409a, 410a, 416a and 409b, 410b, 416b makes it possible to limit the temperature deflections of the membrane caused by the differences in thermal expansion of the component materials of the membrane.

For a more detailed description of the advantages of the shape of such a component, reference may be made to French patent application FR 3,027,448 in the Applicant's name.

Figure 8A:
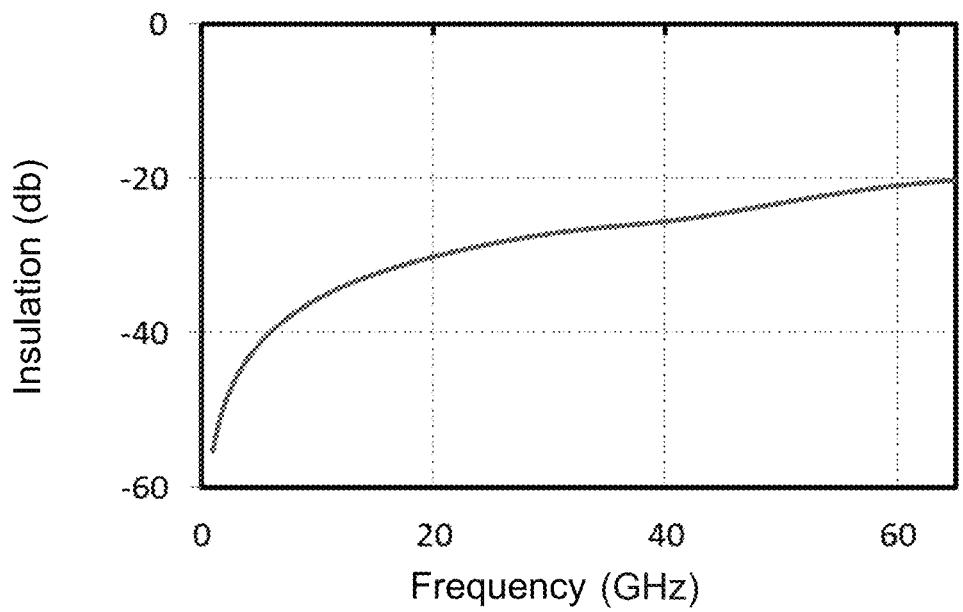
FIGS. 8a and 8b are performance curves of a serial switch according to the present invention, respectively in the non-activated and activated state.

FIG. 8a shows the isolation as a function of frequency for the switch in the serial configuration in the nonactivated state.

Figure 8B:
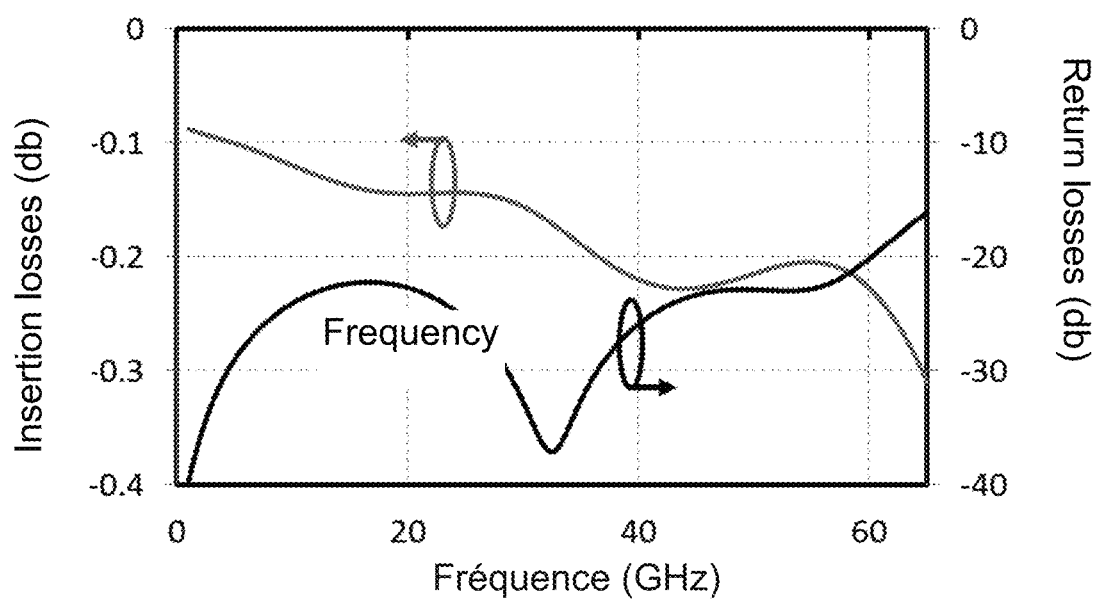

FIG. 8b shows the insertion losses and the adaptation level as a function of the frequency for the switch in the serial configuration in the activated state.

The invention claimed is:

1. A micro-electromechanical switch (MEMS) formed on a substrate, the micro-electromechanical switch comprising:
 a first RF signal line and a second RF signal line formed on the substrate;
 a deformable membrane made from a highly resistive material, the membrane being kept, in a non-deformed state, spaced away from the substrate by anchors secured to the substrate,
 an activation means configured to deform the membrane from its nondeformed state, a substrate track formed on the substrate, opposite the membrane, a membrane track integrated into the membrane and bearing a conductive contact zone opposite the substrate track configured to produce a conductive contact between the substrate track and the membrane track in a deformed state of the membrane, the first RF signal line and the second RF signal line being connected by means of at least one from among the membrane track and the substrate track, the switch being in the on state when a signal is capable of circulating from the first RF signal line to the second RF signal line, and in the off state when a signal cannot circulate from the first RF signal line to the second RF signal line, wherein a membrane RF ground is integrated into the membrane, the membrane RF ground being electrically connected to an RF substrate ground by means of anchors, the membrane RF ground framing and being formed parallel to at least one from among the membrane track and the substrate track, such that the RF ground closely follows the RF signal path, to guide the propagation of the RF signal from the first RF signal line to the second RF signal line when the switch is in the on state.

2. The micro-electromechanical switch (MEMS) according to claim 1, wherein the first RF signal line and the second RF signal line are connected by the membrane track, the substrate track being connected to the RF ground, the off state of the switch being made in the deformed state of the membrane, and the on state of the switch being made in the nondeformed state of the membrane.

3. The micro-electromechanical switch according to claim 1, wherein the contact zone of the membrane is a contact pin protruding from the lower face of the membrane to provide conductive physical contact of the contact pin with the substrate track in the deformed state of the membrane.

4. The micro-electromechanical switch according to claim 1, wherein the membrane is made up of a dielectric material with an electric resistance greater than $5\times10^4$ Ohms·cm.

5. The micro-electromechanical switch according to claim 1, wherein the membrane RF ground is on the lower face of the membrane, opposite the substrate.

6. The micro-electromechanical switch (MEMS) according to claim 1, wherein the first RF signal line and the second RF signal line are connected by the substrate track, the membrane track being connected to the RF ground, the off state of the switch being made in the deformed state of the membrane, and the on state of the switch being made in the nondeformed state of the membrane.

7. The micro-electromechanical switch according to claim 6, wherein the membrane RF ground is made up of two RF ground tracks located on either side of the substrate track.

8. The micro-electromechanical switch (MEMS) according to claim 1, wherein the membrane track is connected at one end to the first RF signal line and the substrate track is connected to the second RF signal line, the on state of the switch being made in the deformed state of the membrane, and the off state of the switch being made in a nondeformed state of the membrane.

9. The micro-electromechanical switch according to claim 8, wherein the micro-electromechanical switch further comprises at least one from among a second membrane track and a second membrane RF ground formed symmetrically to the membrane track relative to a plane parallel to the substrate and median along the thickness of the membrane, and the second RF ground being symmetrical to the membrane RF ground relative to a plane parallel to the substrate and median along the thickness of the membrane.

10. The micro-electromechanical switch (MEMS) according to claim 8, wherein the first RF signal line and the second RF signal line are coplanar, the membrane is rounded, kept spaced away from the substrate by five anchors formed on the substrate, the electrostatic actuation means being made up of an electrostatic activation electrode formed on the substrate opposite the membrane and power supplied by an activation line, the activation electrode being configured, when it is activated by the activation line, to bring the membrane to its deformed state.

11. The micro-electromechanical switch according to claim 8, wherein the membrane RF ground is made up of two RF ground tracks located on either side of the membrane track.

12. The micro-electromechanical switch according to claim 11, wherein the membrane track and the two RF ground tracks are in a same plane parallel to the substrate.

13. The micro-electromechanical switch according to claim 8, wherein the membrane RF ground further comprises at least one from among an RF ground track located above the membrane track track and an RF ground track located below the membrane track, the RF ground track of the membrane RF ground located above the membrane track extending over at least part of the width of the membrane between the anchors and the end of the membrane track connected to the contact zone, and the RF ground track of the membrane RF ground located below the membrane track extending over at least part of the width of the membrane between the anchors and the end of the membrane track connected to the contact zone, leaving the contact zone free.

14. The micro-electromechanical switch according to claim 13, wherein the RF ground tracks of the membrane RF ground are connected by vias in the membrane formed on either side of the conductive track.

* * * * *